US008116081B2

(12) United States Patent
Crick, Jr.

(10) Patent No.: US 8,116,081 B2
(45) Date of Patent: Feb. 14, 2012

(54) DIGITAL DISPLAY KIOSK

(75) Inventor: John Edward Crick, Jr., Independence, MO (US)

(73) Assignee: Cinema Scene Marketing & Promotions, LLC, Overland Park, KS (US)

( * ) Notice: Subject to any disclaimer, the term of this patent is extended or adjusted under 35 U.S.C. 154(b) by 191 days.

(21) Appl. No.: 12/471,210

(22) Filed: May 22, 2009

(65) Prior Publication Data

US 2010/0296234 A1 Nov. 25, 2010

(51) Int. Cl.
*H05K 7/20* (2006.01)

(52) U.S. Cl. .................... 361/724; 361/679.23; 361/728; 361/735; 725/143; D14/308

(58) Field of Classification Search ............. 361/679.23, 361/725, 728; D6/396
See application file for complete search history.

(56) References Cited

U.S. PATENT DOCUMENTS

| | | | | |
|---|---|---|---|---|
| 2,912,066 | A * | 11/1959 | Ellithorpe | 186/37 |
| D294,437 | S * | 3/1988 | Tombs et al. | D6/397 |
| 5,281,018 | A * | 1/1994 | Cullinan | 312/223.2 |
| 5,587,740 | A | 12/1996 | Brennan | |
| 5,623,581 | A | 4/1997 | Attenberg | |
| D380,457 | S * | 7/1997 | Senturia et al. | D14/305 |
| 5,663,746 | A * | 9/1997 | Pellenberg et al. | 345/581 |
| 5,677,830 | A * | 10/1997 | Nogas et al. | 361/790 |
| 5,826,882 | A * | 10/1998 | Ward | 273/309 |
| 5,913,019 | A | 6/1999 | Attenberg | |
| 5,940,274 | A * | 8/1999 | Sato et al. | 361/725 |
| 6,078,848 | A * | 6/2000 | Bernstein et al. | 700/237 |
| 6,289,326 | B1 * | 9/2001 | LaFleur | 312/258 |
| 6,369,908 | B1 | 4/2002 | Frey et al. | |
| 6,422,670 | B1 * | 7/2002 | Hedrick et al. | 312/223.1 |
| 6,449,143 | B2 * | 9/2002 | Rooyakkers et al. | 361/679.04 |
| 6,554,504 | B2 | 4/2003 | Cook et al. | |
| 6,574,110 | B1 * | 6/2003 | Budinger et al. | 361/729 |
| 6,591,247 | B2 | 7/2003 | Stern | |
| 6,646,863 | B1 * | 11/2003 | White et al. | 361/679.2 |
| 6,697,944 | B1 | 2/2004 | Jones et al. | |
| 6,945,457 | B1 * | 9/2005 | Barcelou | 235/380 |
| 7,036,734 | B2 * | 5/2006 | Baker | 235/451 |
| 7,142,417 | B1 * | 11/2006 | Doebertin et al. | 312/223.1 |
| 7,212,308 | B2 | 5/2007 | Morgan | |
| 7,269,030 | B2 * | 9/2007 | Miller et al. | 361/797 |
| 7,301,664 | B2 | 11/2007 | Freeny et al. | |
| 7,374,258 | B2 * | 5/2008 | Bowron | 312/7.2 |
| D579,686 | S * | 11/2008 | Collins et al. | D6/396 |
| 2002/0124271 | A1 * | 9/2002 | Herrmann et al. | 725/151 |
| 2005/0162836 | A1 * | 7/2005 | Briggs et al. | 361/724 |
| 2007/0200867 | A1 * | 8/2007 | Reynolds et al. | 345/589 |
| 2008/0002346 | A1 * | 1/2008 | Lin et al. | 361/683 |
| 2008/0255901 | A1 * | 10/2008 | Carroll et al. | 705/7 |
| 2008/0318671 | A1 * | 12/2008 | Rowe et al. | 463/26 |
| 2009/0113116 | A1 * | 4/2009 | Thompson et al. | 711/103 |
| 2010/0204876 | A1 * | 8/2010 | Comeau et al. | 701/32 |

* cited by examiner

*Primary Examiner* — Jinhee Lee
*Assistant Examiner* — Anthony Q Edwards
(74) *Attorney, Agent, or Firm* — Erickson, Kernell, Derusseau & Kleypas, LLC

(57) ABSTRACT

A display kiosk for housing a flat screen monitor and associated electronic equipment is disclosed. The display kiosk includes a lower unit assembly and an upper unit assembly. The display kiosk is assembled in two parts and provides easy access to the internal components for maintenance, repair and upgrades.

6 Claims, 4 Drawing Sheets

DIGITAL DISPLAY KIOSK

FIELD

The present invention relates to digital displays and, more particularly, to a digital display kiosk for displaying static images, movie trailers and advertisements.

BACKGROUND

It is known in the art to provide video, audio and data in movie theaters. (In more recent years, previews of currently showing and upcoming features, as well as brand advertising have been displayed on television screens or monitors located throughout the theater lobby.) In some systems the displays are mounted in a single unit, which are the mounted to a wall, ceiling or floor. Assembly and mounting of the unit is often difficult and cumbersome because of the size and weight of the unit. Further, the units must be dismounted to be serviced.

SUMMARY

The present invention provides an improved display kiosk. The display kiosk includes a two-piece design to ease mounting and assembly of the unit. A lower unit assembly houses a computer, speaker and electronic controls for the display kiosk. The lower unit assembly includes a base and upright supports that provide stability to free-standing units, and a front access door to provide access to the components mounted for installation, maintenance and updates. The upper unit assembly fits into the bottom portion and includes display brackets, a front panel, a bezel and dome cover. The display brackets allow the upper unit assembly to be attached to the lower unit assembly and mounted to a wall before installation of the display. The front bezel is removable to permit access to the cabling and components mounted in the upper unit assembly without removing the unit or upper unit assembly. The dome protects the wireless antenna and provides a lighted portion that may be adapted to change colors in coordination with the images presented on the display. (Some domes exclude the lighted portion and are merely intended to protect wireless antenna.)

DETAILED DESCRIPTION

Figure 1:
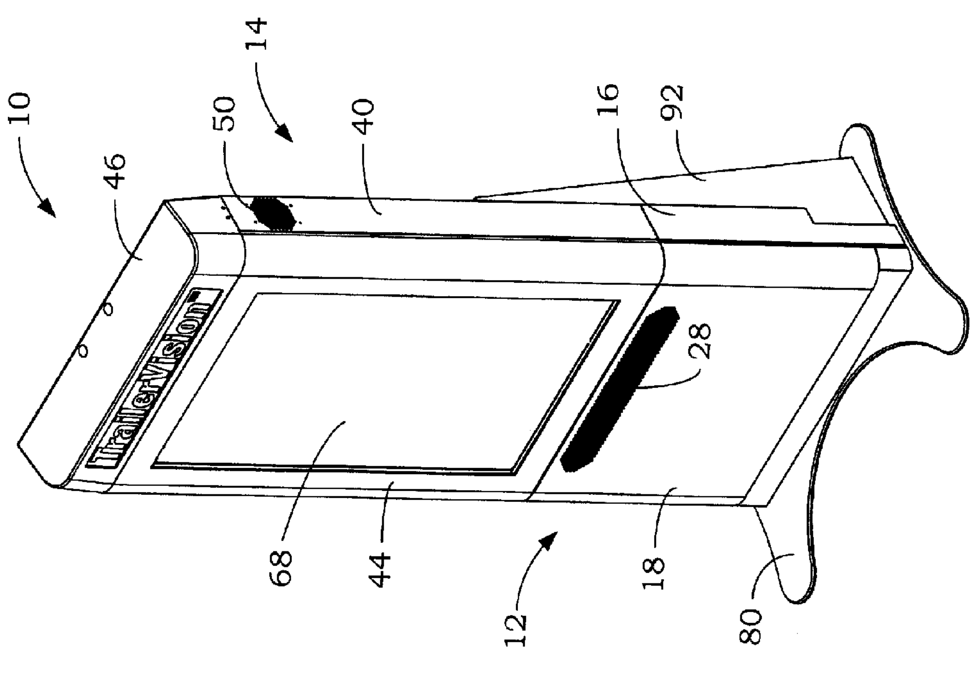
FIG. 1 is a front perspective view of a display kiosk of the present invention.
Figure 2:
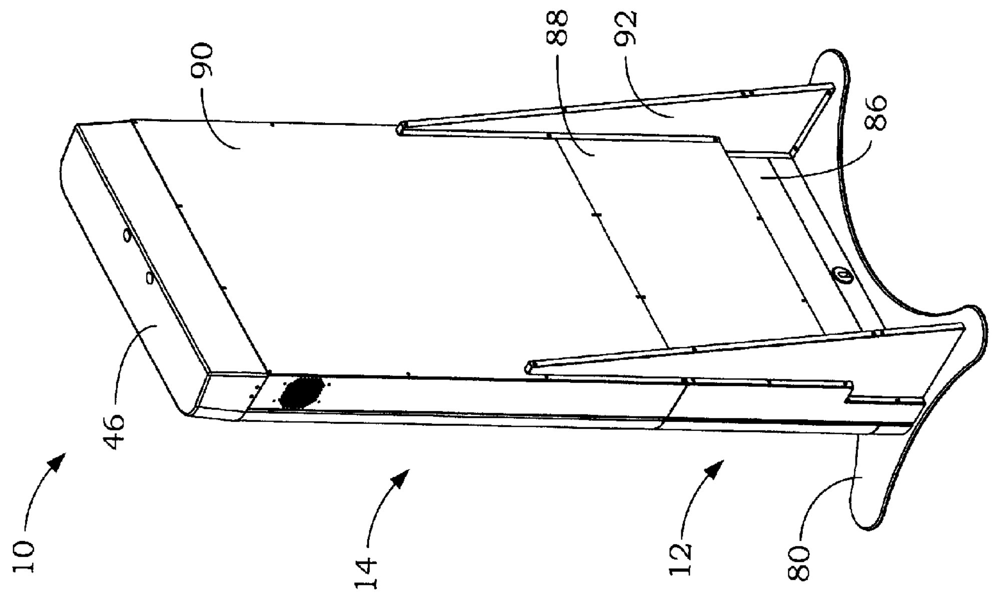
FIG. 2 is a rear perspective of the display kiosk of FIG. 1.
Figure 5:
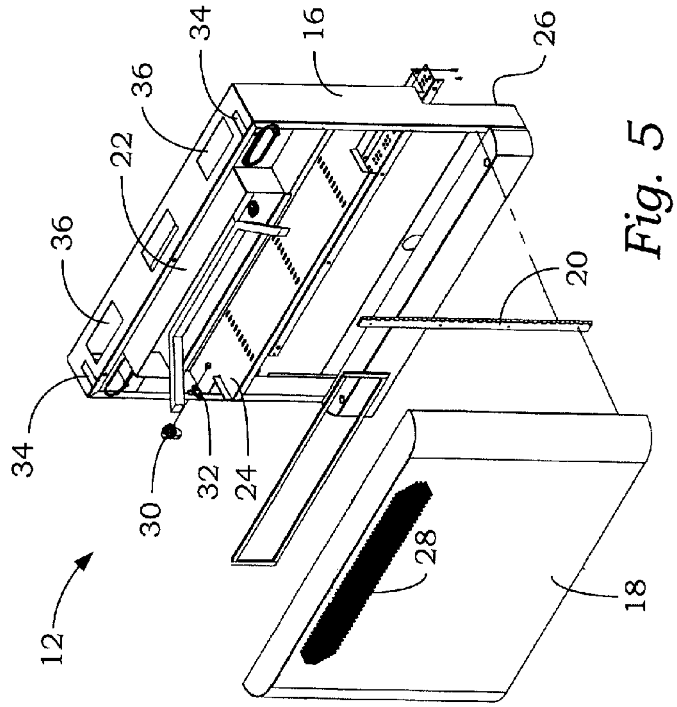
FIG. 5 is an exploded front perspective view of the lower unit assembly.
Figure 4:
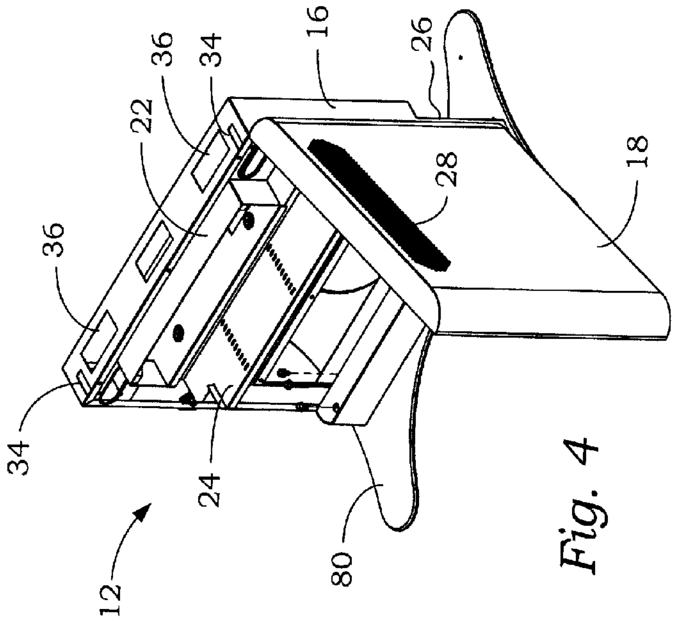
FIG. 4 is a front perspective view of a lower unit assembly of the display kiosk of FIG. 1.
Figure 3:
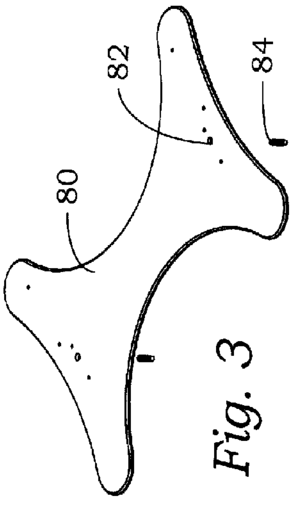
FIG. 3 is a perspective view of a base plate.
Figure 7:
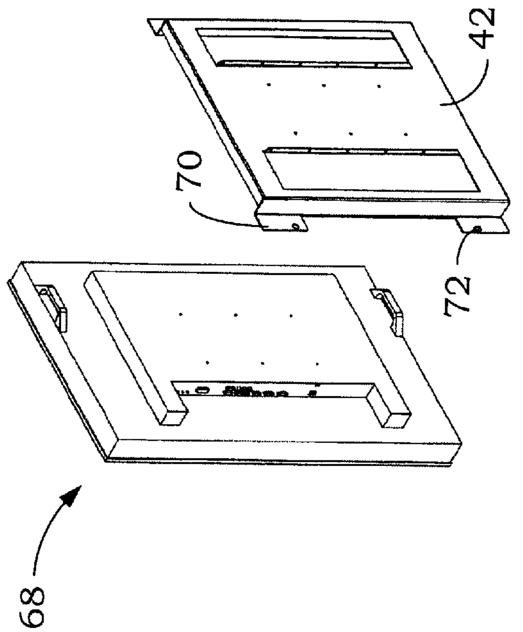
FIG. 7 is an exploded rear perspective view of the monitor bracket and a flat screen monitor of FIG. 6.
Figure 6:
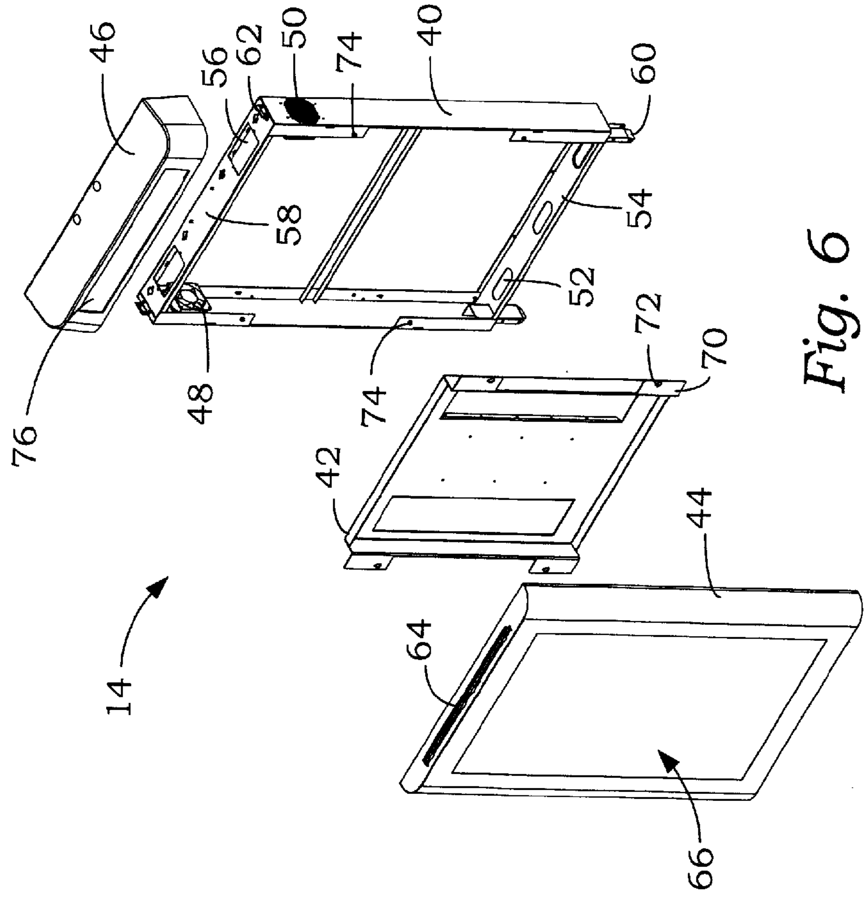
FIG. 6 is an exploded front perspective view of an upper unit assembly of the display kiosk of FIG. 1.
Figure 9:
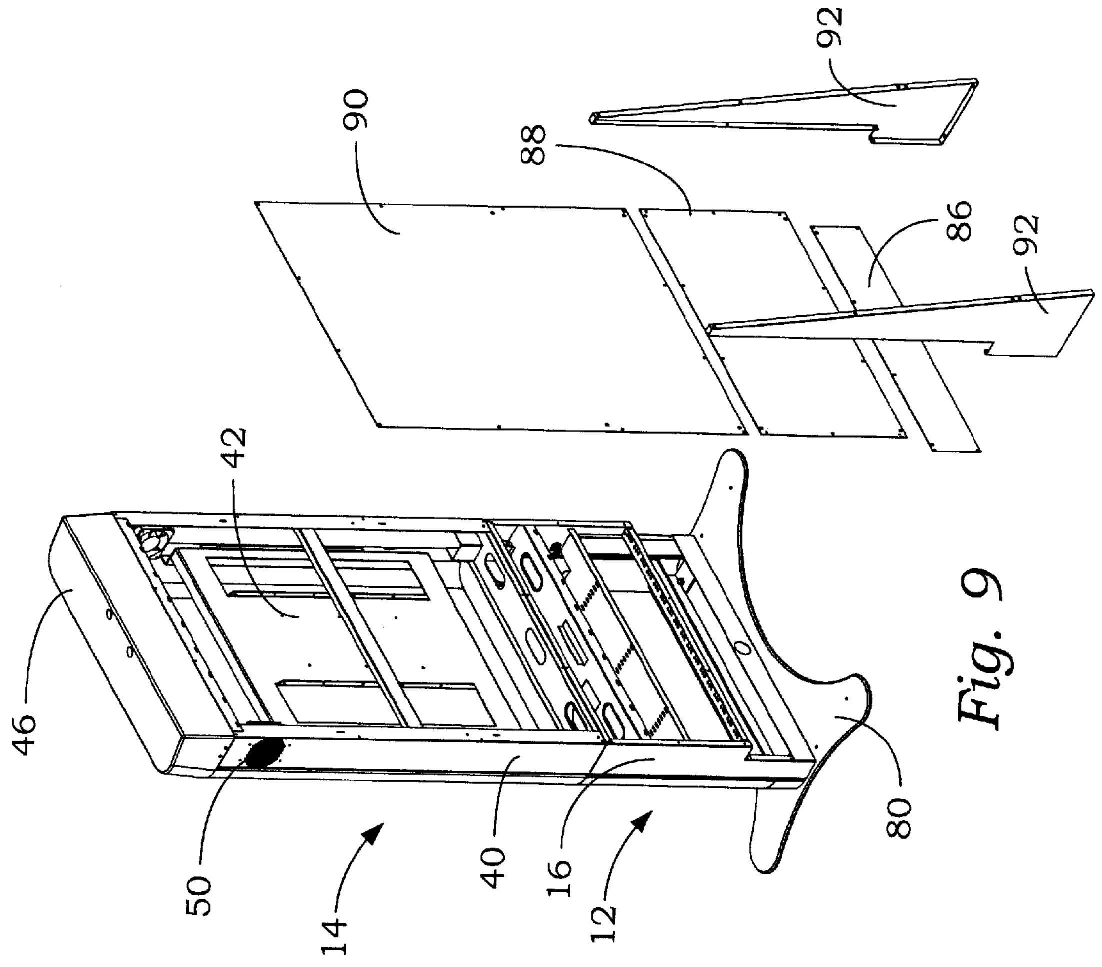
FIG. 9 is an exploded rear perspective view of the display kiosk of FIG. 1.
Figure 8:
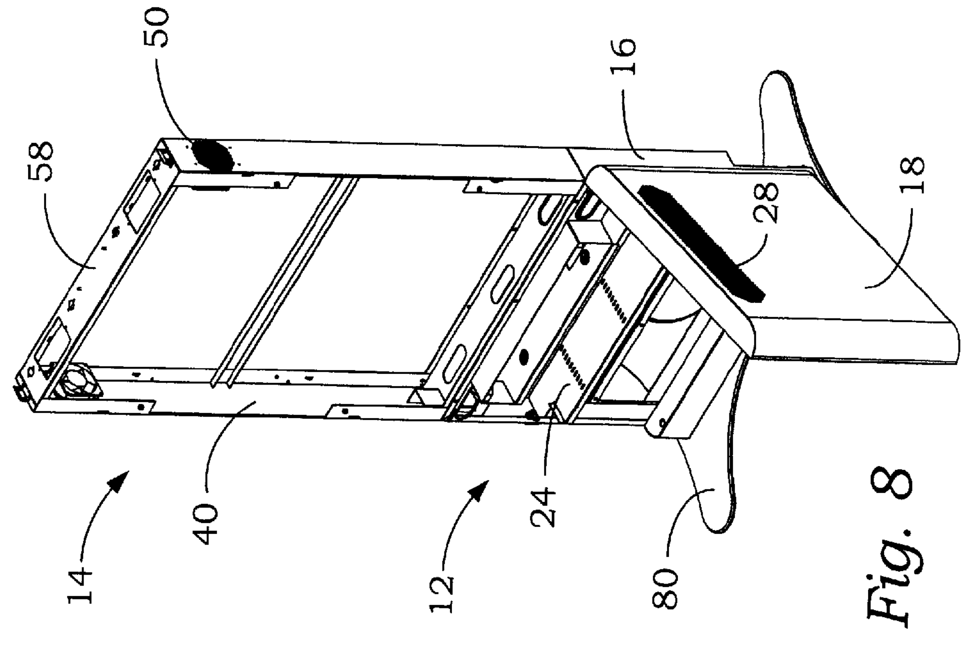
FIG. 8 is a front perspective view of the upper unit assembly mounted to the lower unit assembly of the display kiosk of FIG. 1.

Referring to the figures, an embodiment of a display kiosk is generally indicated by reference numeral 10. Display kiosk includes a lower unit assembly 12 and an upper unit assembly 14.

The lower unit assembly 12 includes a chassis 16, a door 18, a piano hinge 20 attaching the door 18 to the chassis 16, a speaker enclosure 22, and equipment shelves 24. The rear of the chassis 16 includes a baseboard cutout 26 to allow clearance of a baseboard along a wall for mounting the display kiosk 10 flush against the wall. The door 18 includes a speaker grill 28 which is aligned with the speaker enclosure 22 mounted in the chassis 16. A combination lock 30 is coupled to a latch 32 to lock the door 18 to prevent unauthorized access to the chassis 16. A pair of slots 34 in chassis 16 provides mounting points for the upper unit assembly 14. Cutouts 36 in chassis 16 provide ventilation and wire runs from the lower unit assembly 12 to the upper unit assembly 14.

The upper unit assembly 14 includes a display frame in chassis 40, a display mounting bracket 42, a bezel 44, and a dome top 46. The display frame 40 includes cooling fans 48 to exhaust heat from the upper unit assembly 14, through fan grills 50. The display frame 40 also includes cutouts 52 through a bottom plate 54 and cutouts 56 through a top plate 58. The cutouts 52 and 56 provide ventilation and wire runs from the lower unit assembly 12 to the upper unit assembly 14, and from the upper unit assembly 14 to the dome top 46, respectively. A pair of mounting tabs 60 extends from the bottom plate 54. A pair of clips 62 extends from the upper plate 58 to hold the dome top 46 in place.

The bezel 44 may include a light kit of one or more rows of LEDs 64. The LEDs 64 may be all the same color or may be a combination of colors. The bezel 44 is nap fitted to the display frame 40 with clips (not shown) or other fasteners. The bezel 44 opening 66 is dimensional to match the dimension of a flat screen display 68 which is mounted in the upper unit assembly 14, and provide a clean finish to the front of the upper unit assembly 14.

The monitor bracket 42 secures the flat screen display 68 in the display frame 40. The flat screen display 68 is secured to the monitor bracket 42 by fasteners (not shown). The monitor bracket 42 includes four corner tabs 70 each with a keyhole 72. The keyholes 72 are aligned with corresponding studs 74 extending from display frame 40, which extend through the keyholes 72 and hold the display frame 40 and flat screen display 68 in place.

When the upper unit assembly 14 is assembled, the dome top 46 may be placed on the top plate 58 and held in place by clips 62 and fasteners (not shown). The dome top 46 may hide a wireless antenna or other equipment (not shown) that may be secured to the top plate 58. The dome top 46 includes a front panel 76 which may be blank or include indicia such as the name of a movie theater, for example. The front panel 76 is readily removable and is preferably made of a plastic, opaque or frosted material. Light from LEDs 64 which may be located behind front panel 76 may provide a back light to indicia on the front panel 76. The entire dome top 46 may be fabricated from a semi-transparent plastic so that the entire dome top 46 can be illuminated by the LEDs 64.

When mounting the display kiosk 10 to a wall or other structure, the lower unit assembly 12 may be fastened to the wall in a desired location. Electronic equipment, a computer, speakers, etc. (not shown) may be installed in the lower unit assembly before or after mounting to the wall. Once the lower unit assembly 12 is fastened to the wall, the upper unit assembly 14 is placed on top of the lower unit assembly 12 with the tabs 60 aligned with the slots 34. The upper unit assembly 14 may then be fastened to the wall. The flat screen display 68 attached to the monitor bracket 42 may be installed in the upper unit assembly 14 before or after securing the upper unit assembly 14 to the wall. Once all the cables and wiring (not shown) are connected to the appropriate electronic equipment (not shown) housed in the display kiosk 10, the bezel 44 may be attached to the display frame 40 and the dome top 46 installed on the top plate 58.

For a free standing installation, a base plate 80 provides stability to the display kiosk 10. Holes are drilled into the floor (not shown) at a spacing corresponding to apertures 82 in base plate 80. Anchors 84 may be inserted in the holes drilled in the floor and the base plate 80 is located over the holes. The lower unit assembly 12 is placed on the base plate 80 aligning apertures (not shown) in a bottom plate (not shown) of the chassis 16 with the base plate apertures 82. Bolts (not shown) are inserted through the apertures in the bottom plate (not shown) of the chassis 16 through the base plate 80 and tightened to the anchors 84. The display kiosk 10 may then be assembled as discussed above.

Once the lower unit assembly 12 and upper unit assembly 14 are fastened together, back panels 86, 88 and 90 may be fastened to the lower unit assembly 12 and upper unit assembly 14, respectively. Upright supports 92 may be attached on each side of the rear of display kiosk 10 by fastening the upright support 92 to the base plate 80 and the lower unit assembly 12 and upper unit assembly 14 to provide stability to the free standing installation. In the wall mounted installation the back plates 86, 88 and 90, and upright supports 92 need not be installed.

It is to be understood that while certain forms of this invention have been illustrated and described, it is not limited thereto, except in so far as such limitations are included in the following claims and allowable equivalents thereof.

Having thus described the invention, what is claimed as new and desired to be secured by Letters Patent is:

1. A display kiosk for housing a flat screen monitor with a viewable display, one or more speakers and associated electronic equipment comprising:

a lower unit assembly and an upper unit assembly, said lower unit assembly having a chassis having a front opening, a door secured to said chassis and adapted to cover said front opening of said chassis, a mounting structure secured within said chassis to support the electronic equipment, and at least one slot in an upper surface of said chassis, said upper unit assembly having a display frame having a front opening, a display mounting bracket releasably secured to said display frame, said display mounting bracket adapted to secure said flat screen monitor within said display frame wherein said viewable display of said flat screen monitor is facing said front opening of said display frame, a bezel having an opening with dimensions corresponding to the flat screen monitor viewable display, said bezel secured to said display frame wherein said viewable display of said flat screen monitor is viewable through said bezel, and at least one mounting tab extending from a lower surface of said display tabs and aligned with said at least one slot in said upper surface of said upper of said upper surface of said chassis to secure said upper unit assembly to said lower unit assembly, wherein said door of said lower unit assembly includes a speaker grill opening, and said one or more speakers are mounted within said chassis to said door in alignment with said speaker grill opening.

2. The display kiosk of claim 1 further comprising a plurality of LEDs mounted to an upper surface of said display frame and controlled by the associated electronic equipment.

3. The display kiosk of claim 2 further comprising a dome top secured to said upper surface of said display frame and over said LEDs and any electronic equipment mounted to said upper surface of said display frame, said dome top having a translucent front panel to allow transmission of light from said LEDs.

4. The display kiosk of claim 1 further comprising a base plate fastened to said lower unit assembly for securing said display kiosk to a floor.

5. The display kiosk of claim 4 further comprising upright structure fastened to said base plate and a rear portion of said display kiosk to provide stability and support.

6. The display kiosk of claim 5 further comprising one or more rear panels secured to a rear surface of said display kiosk for covering one or more openings in said rear surface of said display kiosk.

* * * * *

UNITED STATES PATENT AND TRADEMARK OFFICE

CERTIFICATE OF CORRECTION

PATENT NO. : 8,116,081 B2
APPLICATION NO. : 12/471210
DATED : February 14, 2012
INVENTOR(S) : John Edward Crick, Jr.

It is certified that error appears in the above-identified patent and that said Letters Patent is hereby corrected as shown below:

Column 4, line 14, claim 1: please delete "said upper of said upper surface of"

Signed and Sealed this
Seventeenth Day of April, 2012

David J. Kappos
*Director of the United States Patent and Trademark Office*